United States Patent
Smith et al.

(10) Patent No.: US 6,891,768 B2
(45) Date of Patent: May 10, 2005

(54) POWER-SAVING READING OF MAGNETIC MEMORY DEVICES

(75) Inventors: Kenneth Kay Smith, Boise, ID (US); Frederick A. Perner, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 41 days.

(21) Appl. No.: 10/293,027

(22) Filed: Nov. 13, 2002

(65) Prior Publication Data

US 2004/0090852 A1 May 13, 2004

(51) Int. Cl.$^7$ ................................................. G11C 7/02
(52) U.S. Cl. ............. 365/207; 365/189.07; 365/189.11; 365/213
(58) Field of Search ............................ 365/207, 189.07, 365/189.11, 213

(56) References Cited

U.S. PATENT DOCUMENTS

| | | | |
|---|---|---|---|
| 5,258,669 A | 11/1993 | Nakashima | |
| 5,400,279 A | 3/1995 | Momodomi et al. | |
| 6,504,750 B1 * | 1/2003 | Baker | 365/148 |
| 6,590,804 B1 * | 7/2003 | Perner | 365/207 |
| 6,625,076 B2 * | 9/2003 | Weber et al. | 365/207 |

* cited by examiner

Primary Examiner—Van Thu Nguyen
Assistant Examiner—Pho M. Luu

(57) ABSTRACT

Power-saving reading of magnetic memory devices. In one arrangement, a method includes pulsing a voltage on the array, and obtaining a voltage value indicative of a memory state of the target memory cell from the voltage pulse using a sensing circuit that is electrically connected to the target memory cell. In another arrangement, a method includes pulsing an array voltage on a plurality of row and column conductors of the array, connecting a sensing circuit to a conductor that is electrically coupled to the target memory cell, the sensing circuit including a sense element, and determining the voltage drop across the sense element of the sensing circuit during the voltage pulse, the voltage drop being indicative of a memory state of the target memory cell.

40 Claims, 9 Drawing Sheets

POWER-SAVING READING OF MAGNETIC MEMORY DEVICES

FIELD OF THE INVENTION

The present disclosure relates to memory devices. More particularly, the disclosure relates to power-saving reading of magnetic memory devices.

BACKGROUND OF THE INVENTION

Magnetic memory such as magnetic random access memory (MRAM) is a non-volatile, semiconductor-based memory technology in which magnetic, rather than electrical, charges are used to store bits of data.

Typically, magnetic memory devices comprise a plurality of memory cells or bits that are arranged in a two-dimensional array. Each memory cell is configured to store a single bit of information, i.e., a logic value "1" or a logic value "0." Each memory cell of the array is coupled to a column conductor and a row conductor at a cross-point of the conductors.

To write data to a target memory cell, current flow is provided through the column conductor and row conductor associated with the target memory cell. The magnetic fields created by the flow of electrons through the conductors induce magnetic fields to set a permanent magnetization in a sense layer of the memory cell to control its resistivity and, therefore, control the state of the cell.

Reading of a target memory cell can be accomplished in various ways. In one method, an "equipotential" reading scheme is used. This reading scheme is represented in FIG. 1. In this figure, a cross-point array 100 is illustrated that includes a plurality of memory cells 102 that are represented by resistors. Each of the memory cells 102 is electrically coupled to a column conductor 104 and a row conductor 106. During an equipotential read, each column conductor 104 is connected to an array voltage, $V_A$, except for a column conductor that is coupled to a target memory cell, T. Similarly, each row conductor 106 except the row conductor coupled to the target memory cell, T, is connected to $V_A$.

As indicated in FIG. 1, the column conductor 104 coupled to the target memory cell, T, is connected to a sense voltage, $V_A'$, which approximates $V_A$ and which, as is discussed below, is used to sense the memory state of the target memory cell. As is also shown in FIG. 1, the row conductor 106 coupled to the target memory cell, T, is connected to ground. With this arrangement, array current, $I_A$, will flow through the non-target memory cells 102 coupled to the row conductor 106 that is also coupled to the target memory cell, T. In addition, sense current, $I_{sense}$, flows through the target memory cell, T. Due to the application of $V_A$ to the row conductors not coupled to the target memory cell, T, sneak currents are minimized.

FIG. 2 illustrates an example sensing circuit 200 presently used to determine the memory state of target memory cells. As indicated in this figure, the sensing circuit 200 includes an operational amplifier 202, a first field-effect transistor (FET) 204, a second FET 206, a capacitor 208, a comparator 210, and a counter/memory 212. The operational amplifier 202 receives an input of $V_A$ into its positive terminal and outputs $V_A'$ to the column conductor coupled to the target memory cell. The circuit 200 is further connected to a voltage source, $V_{dd}$, whose current flow is controlled with the FET 206 via a control line 214. By way of example, the FET 206 comprises a p-type metal-oxide semiconductor field-effect transistor (MOSFET).

During a read operation, $V_A$ is applied to the array in the manner described above with regard to FIG. 1. In addition, $V_{dd}$ is applied to generate the sense current, $I_{sense}$, which passes through the FET 204, e.g., an n-type MOSFET, to flow to the target memory cell. Current also flows to the capacitor 208 so as to increase the potential of the capacitor until it is equal to $V_{dd}$. The operational amplifier 202 adjusts the gate of the FET 204 to ensure that $V_A'$ is substantially equal to $V_A$. Once a steady-state condition is obtained, the amplifier 202 opens the gate of the FET 206 such that the capacitor 208 provides the current needed to maintain $V_A'$.

The capacitor 208 slowly discharges its voltage until its voltage is reduced to a reference voltage, $V_{ref}$, that, along with the capacitor voltage, is input into the comparator 210. This discharge is depicted in FIG. 3, which illustrates capacitor voltage, $V_{cap}$, over time. As indicated in the figure, the voltage of the capacitor increases to $V_{dd}$ and is then depleted until reaching, and dropping below, $V_{ref}$. The time required to reach $V_{ref}$ depends upon the resistance of the target memory cell and, therefore, provides an indication of the memory state of the cell. For instance, in a scheme in which a higher resistance indicates a logic value "1" and a lower resistance indicates a logic value "0," a logic value "0" is indicated if $V_{ref}$ is reached after the elapse of time, $t_1$, and a logic value "1" is indicated if $V_{ref}$ is reached after the elapse of time, $t_2$. The time it takes for the voltage of the capacitor 208 to drop to $V_{ref}$ is measured and stored by the counter/memory 212.

FIG. 4 depicts the voltage applied to the array during a read. As indicated in this figure, $V_A$ must be applied to the array at least until the time required for the capacitor voltage to be reduced to $V_{ref}$. Although this amount of time is not large in an absolute sense, for instance on the order of 5 to 15 microseconds ($\mu s$), in that $V_A$ is applied to each memory cell coupled to the target memory cell's row conductor, a relatively large amount of current is burned in the array while waiting for the capacitor to discharge its voltage. In the aggregate, the amount of current spent during reading becomes significant.

Another known reading method uses a "non-equipotential" reading scheme. This reading scheme is represented in FIG. 5. As shown in this figure, $V_A$ is applied only to the row conductor 106 that is coupled to the target memory cell, T; all other row conductors 106 are tied to ground. The column conductor 104 coupled to the target memory cell, T, is connected to a sense circuit 600 that is illustrated in FIG. 6. The sense circuit 600 includes an analog-to-digital (A/D) converter 602 and a memory 604. In this figure, the resistance provided by the column conductor can be represented by a voltage divider 606 that comprises a resistor $R_T$, representing the resistance of the target memory cell, and resistors $R_1$ and $R_3$, representing the parallel combination of the resistances of all the other memory cells coupled to the target memory cell's column conductor (only three shown in FIG. 5).

During a read operation, the A/D converter 602 receives a voltage input equal to the voltage on the column conductor that is coupled to the target memory cell. This voltage is then converted into a digital value and compared multiple times to reference values to determine the resistance of the target memory cell. The conversion and comparison process normally requires a relatively long amount of time where extremely accurate measurement is required, for instance, approximately 50 to 100 $\mu s$. FIG. 7 illustrates the time required to make the state determination. In particular, FIG. 7 shows the A/D converter output being invalid for an extended period of time until finally becoming valid at $t_{valid}$.

Until valid data is obtained, $V_A$ must be applied to the array. This application of voltage is depicted in FIG. 8 which shows $V_A$ being applied at least until time $t_{valid}$. Accordingly, as in the equipotential reading scheme, a relatively large amount of current is used to obtain the data stored by the target memory cell. Again, the amount of current lost can be significant when taken in the aggregate.

SUMMARY OF THE INVENTION

The present disclosure relates to methods for reading a target memory cell of an array of memory cells. In one arrangement, a method comprises pulsing a voltage on the array, and obtaining a voltage value indicative of a memory state of the target memory cell from the voltage pulse using a sensing circuit that is electrically connected to the target memory cell.

The present disclosure also relates to sensing circuits that can be used to read a target memory cell. In one arrangement, a sensing circuit comprises an operational amplifier that is configured to receive an array voltage and output a sense voltage to a conductor of the array that is electrically coupled to the target memory cell, a voltage source that generates a sense current, and a sense element that is electrically coupled to the operational amplifier and the voltage source. In another arrangement, a sensing circuit comprises an operational amplifier that is configured to receive an array voltage and output a sense voltage to a conductor of the array that is electrically coupled to the target memory cell, a voltage source that generates a sense current, a capacitor that is configured to store a voltage equal to a voltage on a conductor electrically coupled to the target memory cell, and a switch associated with the capacitor that is configured to connect and disconnect the capacitor to and from the array.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

As identified above, known reading schemes used to read from cross-point array magnetic memory devices typically waste a relatively large amount of current and therefore power. Disclosed herein are reading schemes that significantly reduce the amount of power that is used to read from such memory devices. As is discussed in greater detail below, the reading schemes each involve the application of an array voltage, $V_A$, to the array for a short period of time so that the voltage is merely pulsed on and off. This pulsing of the array voltage, $V_A$, translates to substantial power savings.

Figure 9:
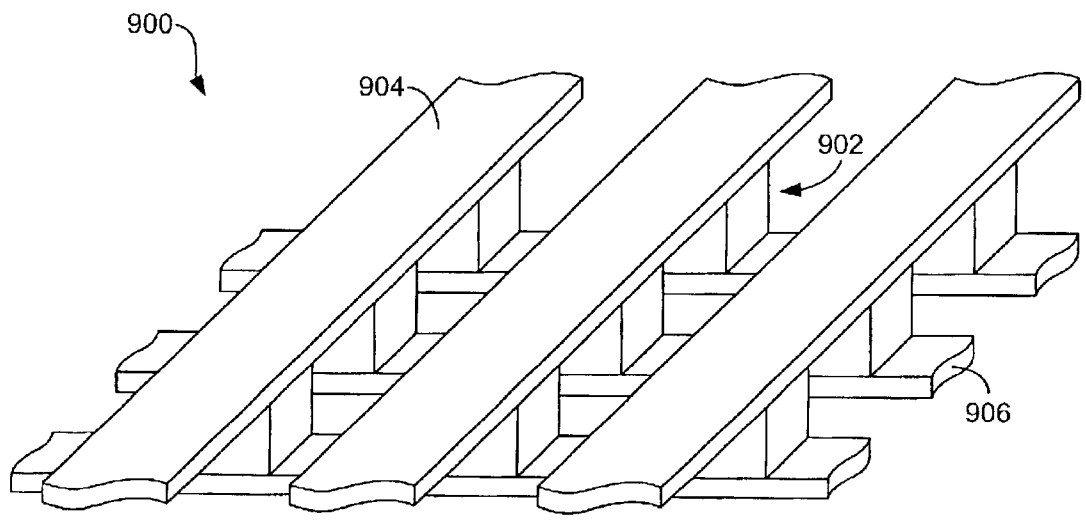
FIG. 9 is a schematic perspective view of an array of memory cells of an embodiment of a magnetic memory device.

Referring now to the drawings, in which like numerals indicate corresponding parts throughout the several views, FIG. 9 illustrates a portion of a cross-point array magnetic memory device 900 that, for instance, can comprise a magnetic random access memory (MRAM) device. The device 900 includes an array of memory cells 902. Although a limited number of memory cells 902 is depicted in FIG. 9, it is to be understood that only a few cells are shown as a representation of the many memory cells of the memory device to facilitate description of the device. In addition to the memory cells 902, the magnetic memory device 900 includes a plurality of column and row conductors 904 and 906.

Figure 10:
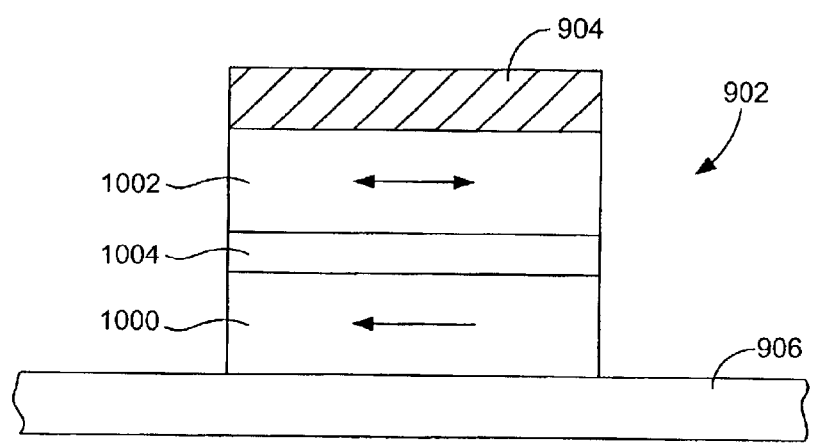
FIG. 10 is a schematic side view of an example memory cell of the array of FIG. 9.

As shown in FIG. 10, each memory cell 902 comprises, for example, first and second magnetic layers 1000 and 1002, one of which is a fixed magnetic layer and the other of which is a free magnetic layer, also known as the sense layer. By way of example, the top magnetic layer 1002 can comprise the free magnetic layer and the bottom magnetic layer 1000 comprises the fixed magnetic layer. Separating the two magnetic layers 1000, 1002 is a thin insulation layer 1004 that may function as a tunnel barrier. With this arrangement, the memory cell 902 behaves as a magnetic tunnel junction (MTJ). Although a MTJ arrangement is shown and described herein, persons having ordinary skill in the art will appreciate that other arrangements are possible. For example, the memory cells can comprise giant magnetoresistive (GMR) elements, if desired.

The memory state of the memory cell 902 can be determined based upon the magnetic orientation of the free magnetic layer, whose magnetic orientation can be toggled from an orientation in which it is aligned with the orientation of the fixed magnetic layer, to an orientation in which it opposes the orientation of the fixed magnetic layer. The former state is called the "parallel" state and the latter state is called the "anti-parallel" state. Typically, the orientation of magnetization in the free layer (also referred to as the data layer or the storage layer) is aligned along its "easy" axis.

The two different states have disparate effects on resistance of the memory cell 902. Specifically, the memory cell 902 has a relatively small resistance when in the parallel state, but has a relatively high resistance when in the anti-parallel state. The parallel state can be designated as representing a logic value "0," while the anti-parallel state can be designated as representing a logic value "1" or vice versa. In such a scheme, the magnetic memory device 900 can be written to by changing the magnetic orientation of the free layer of selected memory cells 902.

Figure 11:
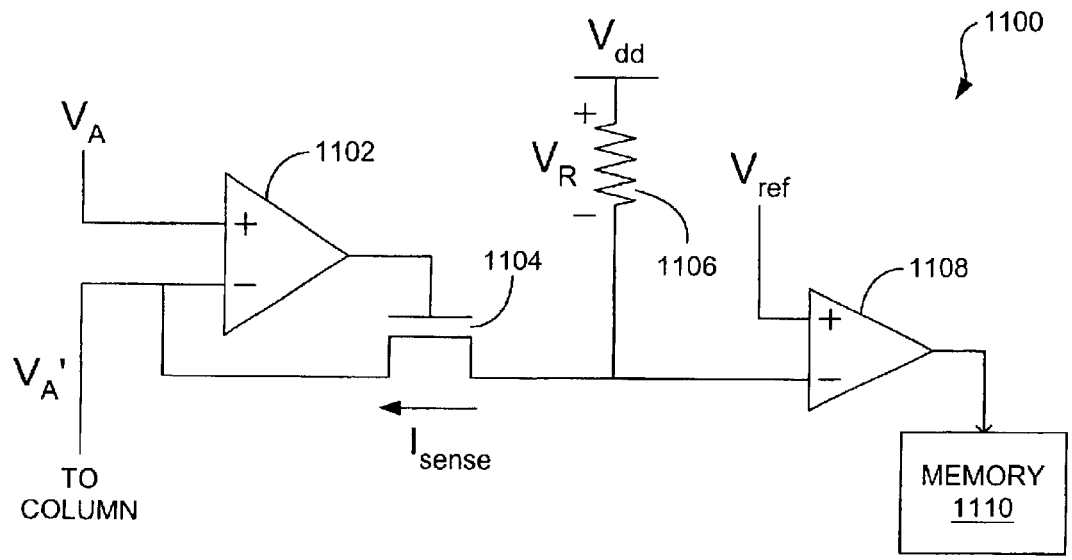
FIG. 11 is a first example sensing circuit that can be used to read data from a magnetic memory device in an equipotential reading scheme.

FIG. 11 illustrates a first example sensing circuit 1100 that can be used in an equipotential reading scheme to determine the memory state of target memory cells 902. As indicated in this figure, the sensing circuit 1100 includes an operational amplifier 1102, a field-effect transistor (FET) 1104, a sense element (such as a resistor) 1106, a comparator 1108, and a memory 1110. The operational amplifier 1102 receives an input of $V_A$ into its positive terminal and outputs $V_A'$ to the column conductor coupled to the target memory cell. As in the prior art equipotential reading scheme, the operational amplifier 1102 adjusts the gate of the FET 1104 to ensure that $V_A'$ is substantially equal to $V_A$.

Figure 1:
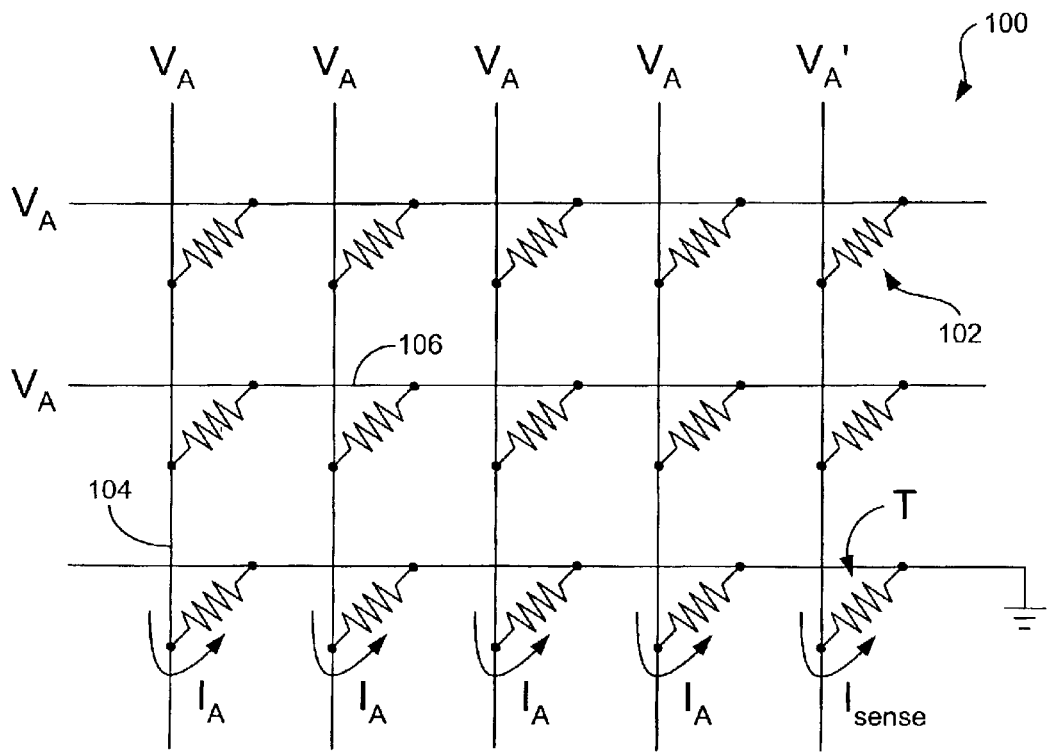
FIG. 1 is a schematic representation of an equipotential reading scheme used with magnetic memory devices.
Figure 2:
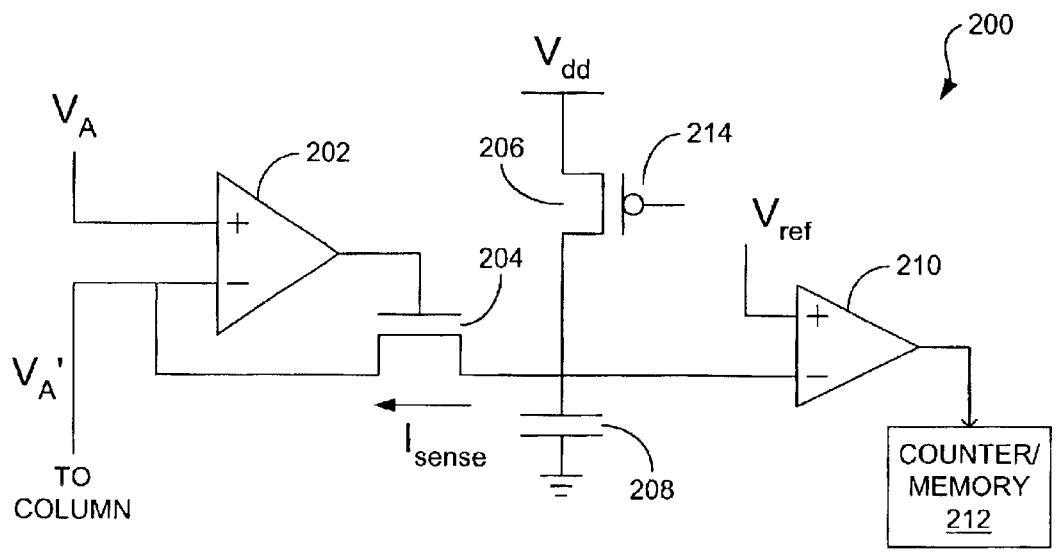
FIG. 2 is a block diagram of a sensing circuit that can be used to read memory cells in the reading scheme of FIG. 1.

During a read operation, $V_A$ is applied to the array of the memory device in the manner described above with regard to FIG. 1. In addition, $V_{dd}$ is applied to the sensing circuit 1100 to generate a sense current, $I_{sense}$, which passes through the FET 1104, e.g., an n-type metal-oxide semiconductor field-effect transistor (MOSFET), to flow to the target memory cell. Before reaching the FET 1104, current flows through the resistor 1106 that, by way of example, comprises a p-type MOSFET. When enabled, the gate of the p-type MOSFET is connected to ground. The size of the transistor is adjusted to give the desired resistance. The resistor 1106 can be implemented as a semiconductor process compatible resistor.

Figure 13:
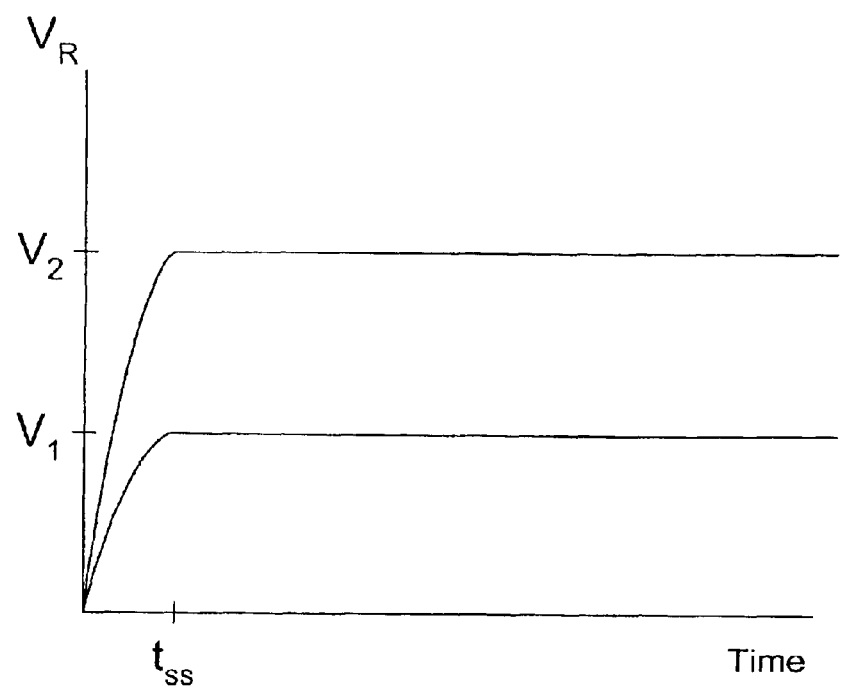
FIG. 13 is a plot of voltages across a sense element of the sensing circuits of FIGS. 11 or 12 as a function of time.

The voltage across the resistor 1106, $V_R$, is depicted in FIG. 13 as a function of time. As indicated in this figure, the voltage across the resistor 1106 quickly reaches a steady-state condition, at $t_{ss}$, for instance after approximately 1 microsecond (µs) or less, reflective of the memory state of the target memory cell. Specifically, the voltage across the resistor 1106 is related to the resistance of the target memory cell according to Ohm's law as follows:

$$V_R = I_{sense} \times R_{resistor} \quad \text{[Equation 1]}$$

where $V_R$ is the resistance across the resistor 1106, $I_{sense}$ is the current that flows through the target memory cell, and $R_{resistor}$ is the resistance of the resistor 1106. In that $I_{sense}$ is equal to $V_A/R_{target}$, where $R_{target}$ is the resistance of the target memory cell, the memory state of the target memory cell can be determined. As indicated in FIG. 13, this voltage can be a relatively low value, $V_1$, or a relatively high value, $V_2$. In a scheme in which high resistance indicates a logic value "1," $V_1$ will represent a logic value "0" and $V_2$ represents a logic value "1." To make the memory state determination, the observed voltage, $V_R$, is input into the comparator 1108 along with a reference voltage, $V_{ref}$, which for instance is equal to that observed when a target memory cell is in either the "0" or "1" state. The two voltages are compared by the comparator 1108, so that it can be determined whether $V_R$ indicates a "0" or "1."

Figure 3:
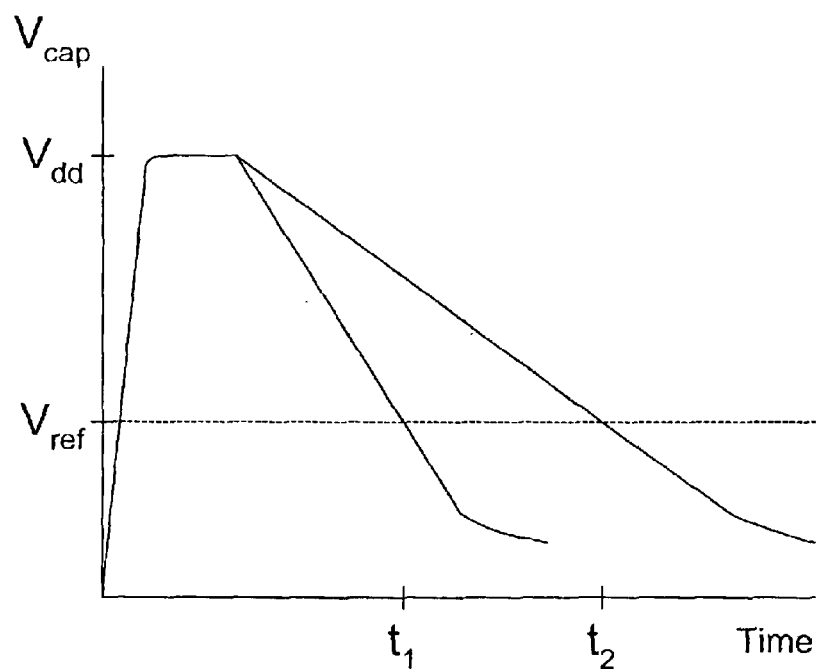
FIG. 3 is a plot of capacitor voltage as a function of time.
Figure 4:
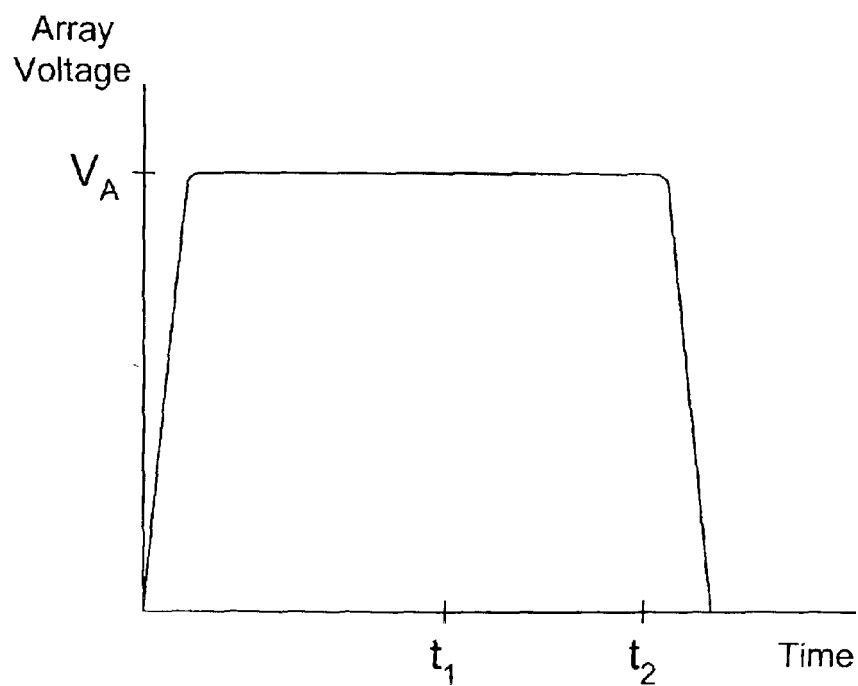
FIG. 4 is a plot of array voltage as a function of time.
Figure 14:
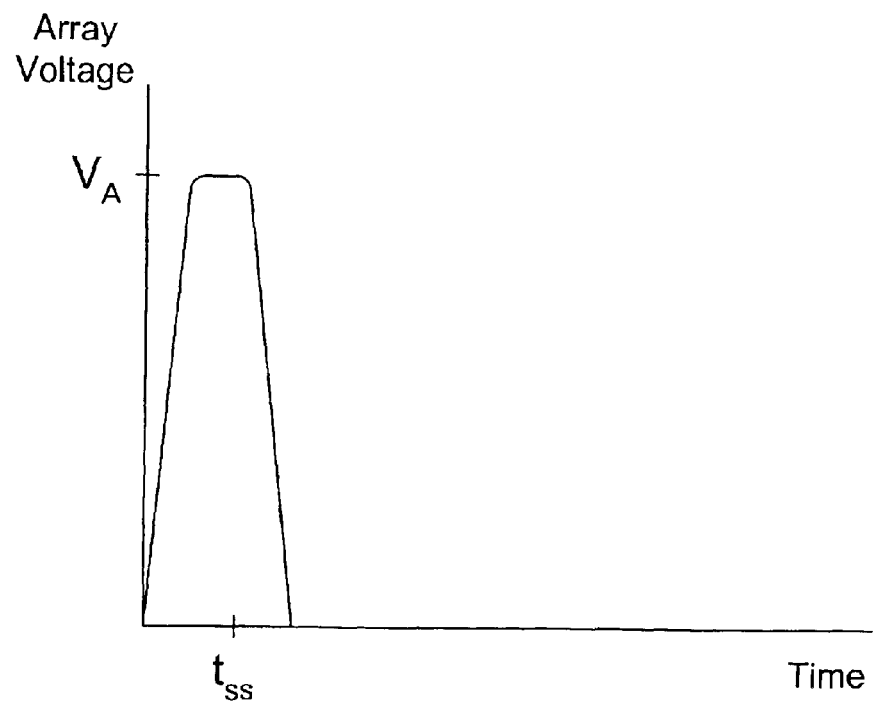
FIG. 14 is a plot of array voltage as a function of time when the sensing circuits of FIGS. 11 or 12 are used.

Irrespective of whether the target memory cell is in the high or low resistance state, $V_A$ can be quickly shut-off such that voltage is merely pulsed on and off, as indicated in FIG. 14. Therefore, in contrast to the situation depicted in FIGS. 3 and 4 when a known equipotential reading scheme is used, current is only used in embodiment of the invention for a very short period of time. The duration of the voltage pulse is less than the 5 µs, which, as noted above, is currently the shortest duration now required to read cells. Indeed, this period of time typically is no greater than approximately 1 µs, thereby providing a vast improvement over known reading techniques. This results in greatly reduced reading power consumption.

Figure 12:
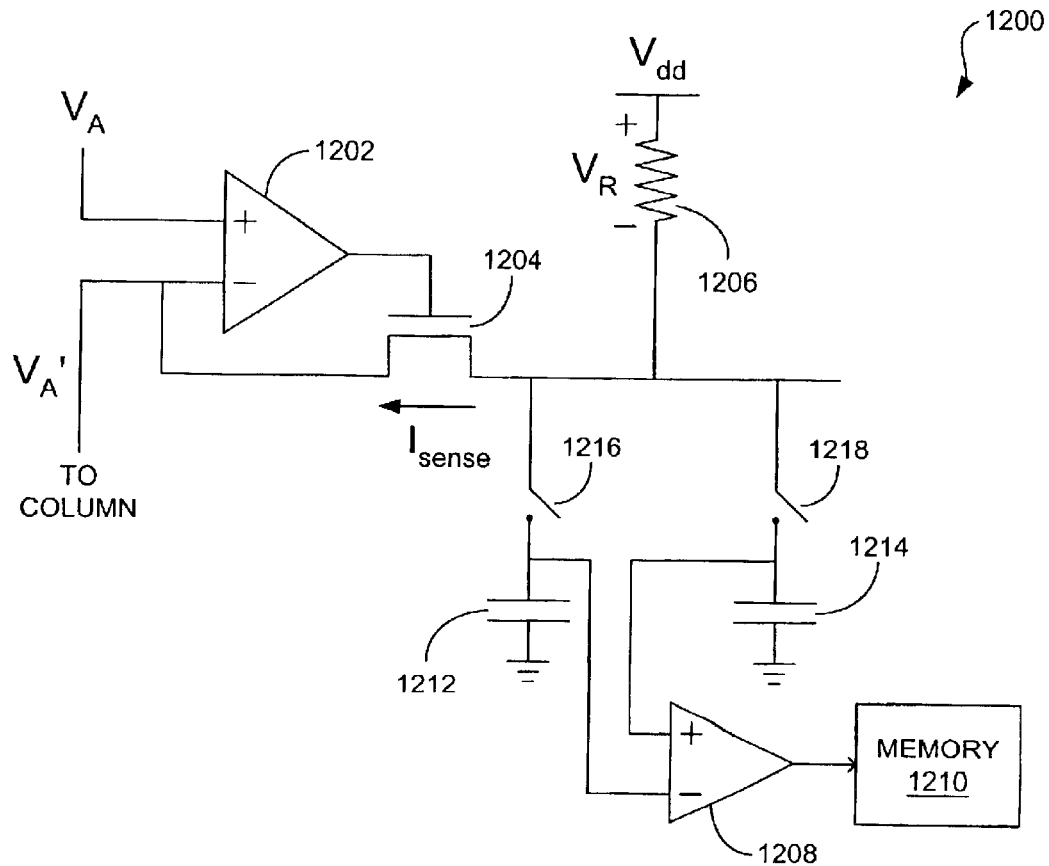
FIG. 12 is a second example sensing circuit that can be used to read data from a magnetic memory device in an equipotential reading scheme.

In that there are manufacturing inconsistencies in fabricating most cross-point array memory devices, the sensing circuit 1100 shown in FIG. 11 depicts an ideal case in which the reference voltage, $V_{ref}$, may be a static value. A common inconsistency is to have varying values of resistance for the same state. To avoid errors that this may produce, a self-referenced sensing scheme can be used. An example self-referenced sensing circuit 1200 is illustrated in FIG. 12. The sensing circuit 1200 is similar to that shown in FIG. 11 and therefore comprises an operational amplifier 1202, a FET 1204, a sense element (e.g., resistor) 1206, a comparator 1208, and a memory 1210. In addition, however, the sensing circuit 1200 includes first and second capacitors 1212 and 1214 that form part of a sample-and-hold circuit. As indicated in FIG. 12, electrical connection of the capacitors 1212 and 1214 to the array is made or broken through switches 1216 and 1218, respectively.

During a read operation, $V_A$ and $V_{dd}$ are applied to the array with the switch 1216 closed. Once the circuit 1200 reaches steady-state, however, the switch 1216 is quickly opened so that the capacitor 1212 is disconnected from the array and stores $V_R$. Next, the target memory cell is written to a known state and the read process initiated again with the switch 1216 open and the switch 1218 closed. Once steady-state is again reached, the switch 1218 is quickly opened to store the newly observed $V_R$ on the capacitor 1214. This voltage is used as a reference voltage that can be compared with the original observed $V_R$ to make the determination as to what was the state of the memory cell.

With the arrangement described above, a low amount of power is consumed during the read operation in that $V_A$ is only applied to the array long enough for the $V_R$ voltages to be stored in the capacitors 1212 and 1214. Specifically, $V_A$ is applied for a duration of less than the 5 µs and, typically, no greater than approximately 1 µs.

Figure 15:
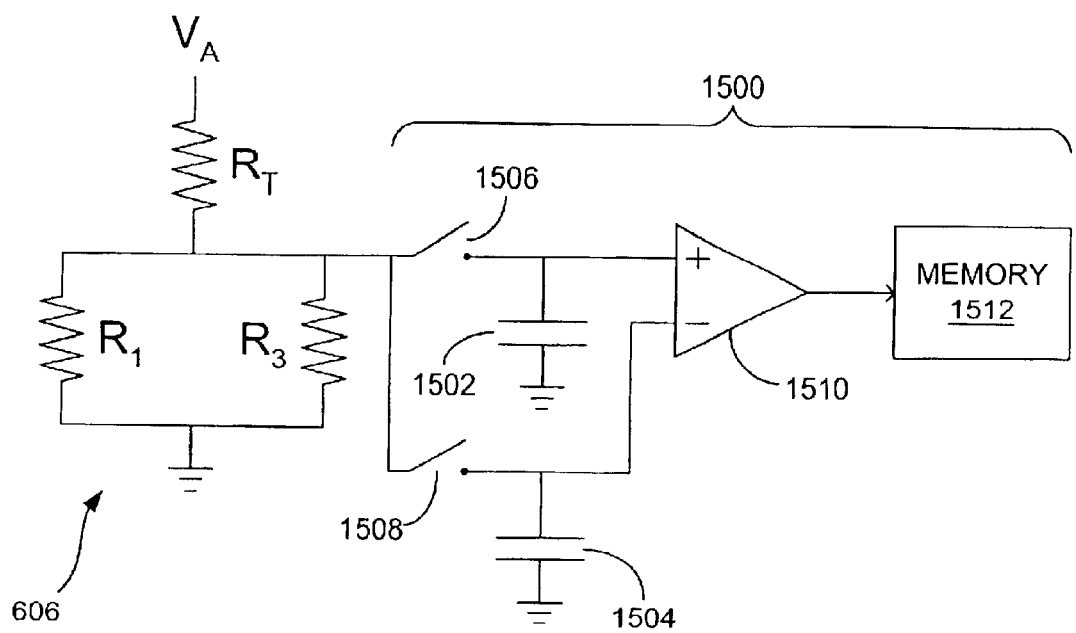
FIG. 15 is a first example sensing circuit that can be used to read data from a magnetic memory device in a non-equipotential reading scheme.

FIG. 15 illustrates an example sensing circuit 1500 that can be used in a non-equipotential reading scheme to determine the memory state of target memory cells. In particular, FIG. 15 illustrates an analog, non-equipotential reading scheme. As indicated in this figure, the sensing circuit 1500 includes first and second capacitors 1502 and 1504 that are electrically coupled to and decoupled from the column conductor of the target memory cell (indicated by the voltage divider 606) with switches 1506 and 1508, respectively. With this configuration, the capacitors 1502, 1504 form part of a sample-and-hold circuit similar to that described above with reference to FIG. 12. The capacitors 1502, 1504 are connected to a comparator 1510, which is used to compare the voltages stored in the capacitors and forward these values to a memory 1512.

Figure 5:
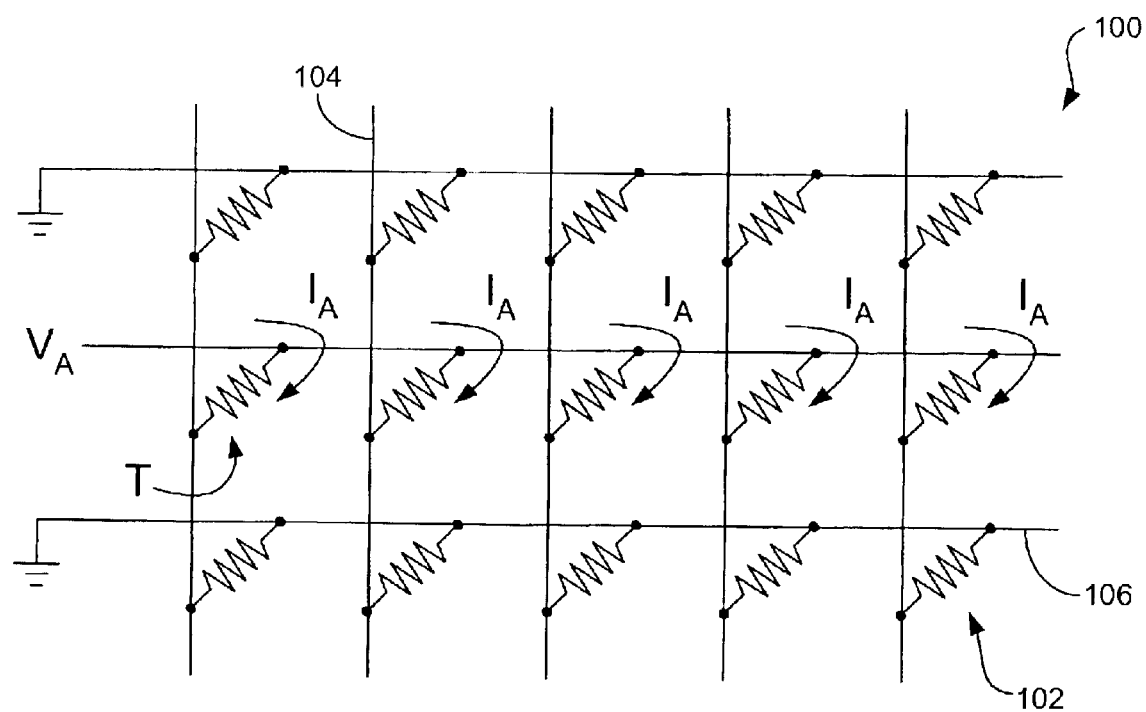
FIG. 5 is a schematic representation of a non-equipotential reading scheme used with magnetic memory devices.
Figure 6:
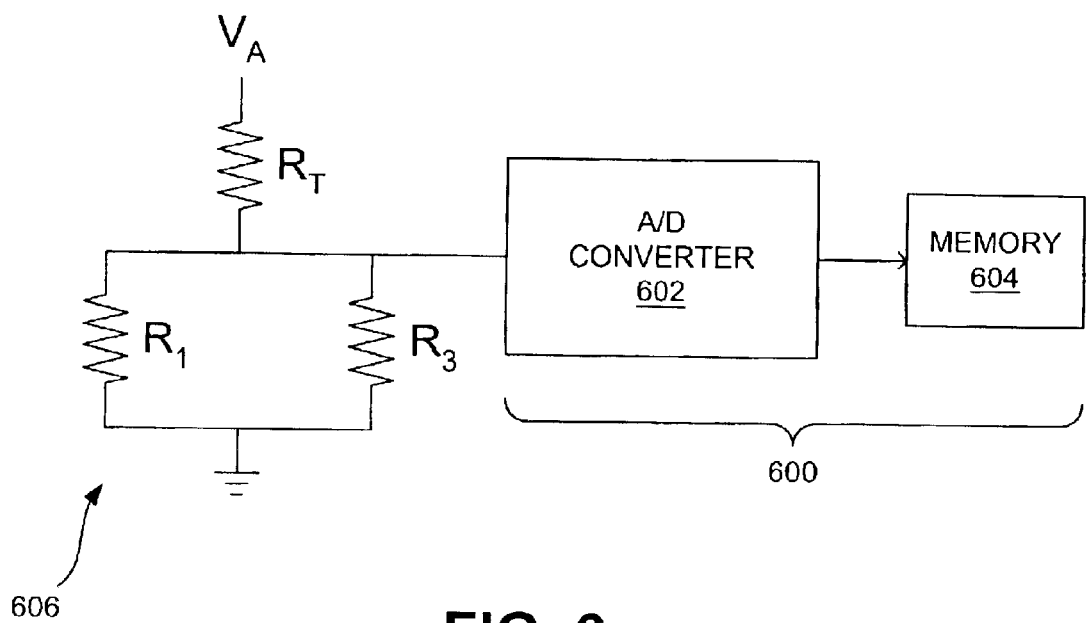
FIG. 6 is a block diagram of a sensing circuit that can be used to read memory cells in the reading scheme of FIG. 5.
Figure 7:
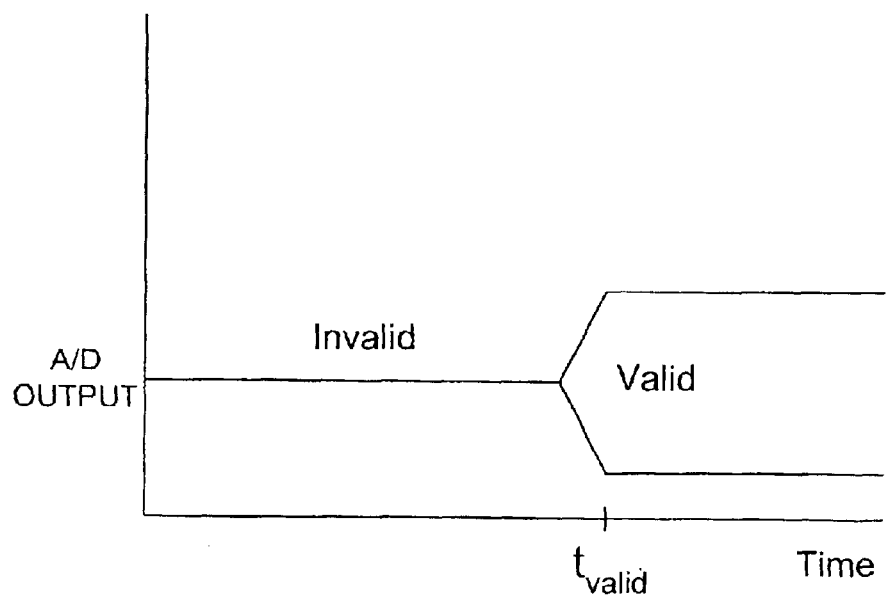
FIG. 7 is a plot of digital output of an analog-to-digital converter as a function of time.
Figure 8:
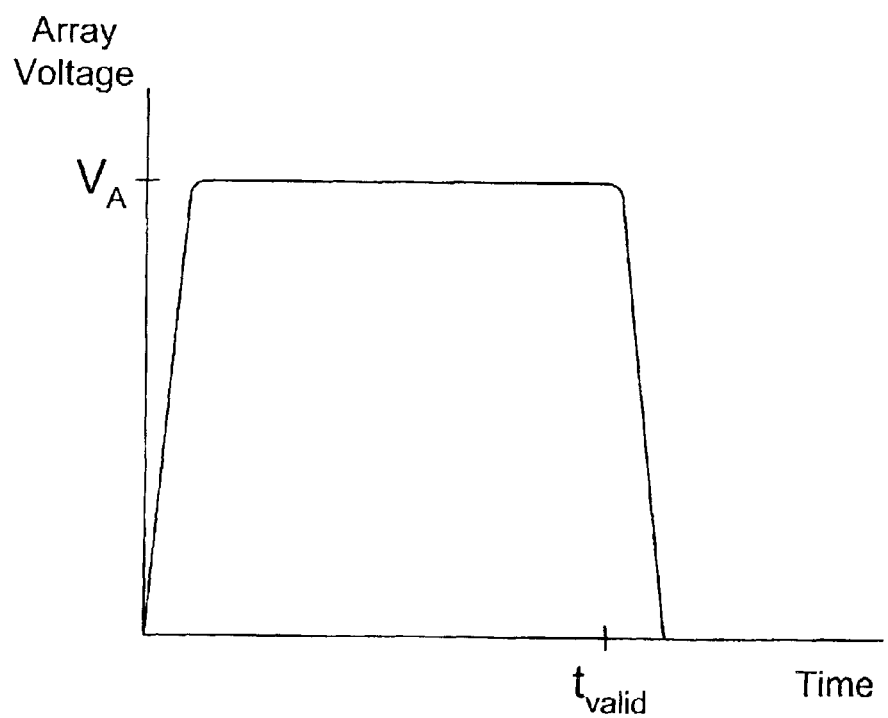
FIG. 8 is a plot of array voltage as a function of time.
Figure 18:
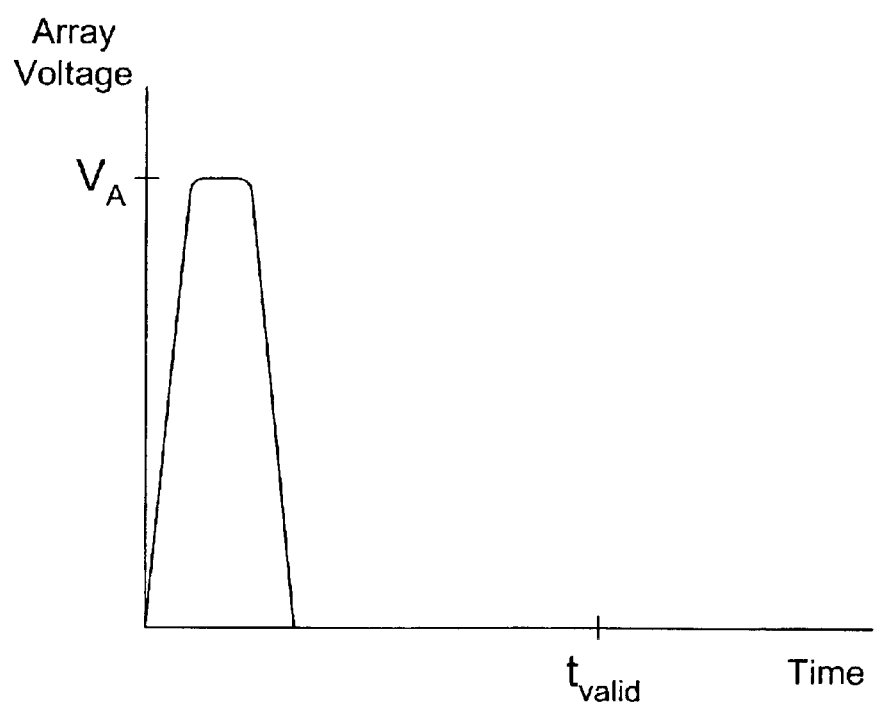
FIG. 18 is a plot of array voltage as a function of time when the sensing circuits of FIGS. 15 or 16 are used.

During a read operation, $V_A$ is applied to the row conductor coupled to the target memory cell as described in relation to FIG. 5. When this voltage is applied, the switch 1506 is closed such that the first capacitor 1502 receives current. The first capacitor 1502 quickly reaches a steady-state condition at which the voltage stored in the capacitor equals that across the column conductor. As with the embodiments described above in relation to FIGS. 11 and 12, this steady-state condition is achieved quickly. At this point, the switch 1506 can be opened and $V_A$ can be shut-off. As indicated in FIG. 18, the voltage pulse is just long enough in duration for the capacitor 1502 to reach the steady-state condition. This duration is less than 5 µs and, typically, is no greater than approximately 1 µs.

To provide for self-referencing, the target memory cell is then written to a known state and the read process initiated again. This time, the switch 1508 is closed such that current will be provided to the second capacitor 1504. Once steady-state is again reached, the switch 1508 is opened and the array voltage, $V_A$, is shut-off. Both stored voltages are input into the comparator 1510 and stored into memory 1512 so that the original memory state of the memory cell can be determined.

Again, in that the array voltage, $V_A$, is only pulsed on and off during the read processes, less current is used and, therefore, less power is consumed.

Figure 16:
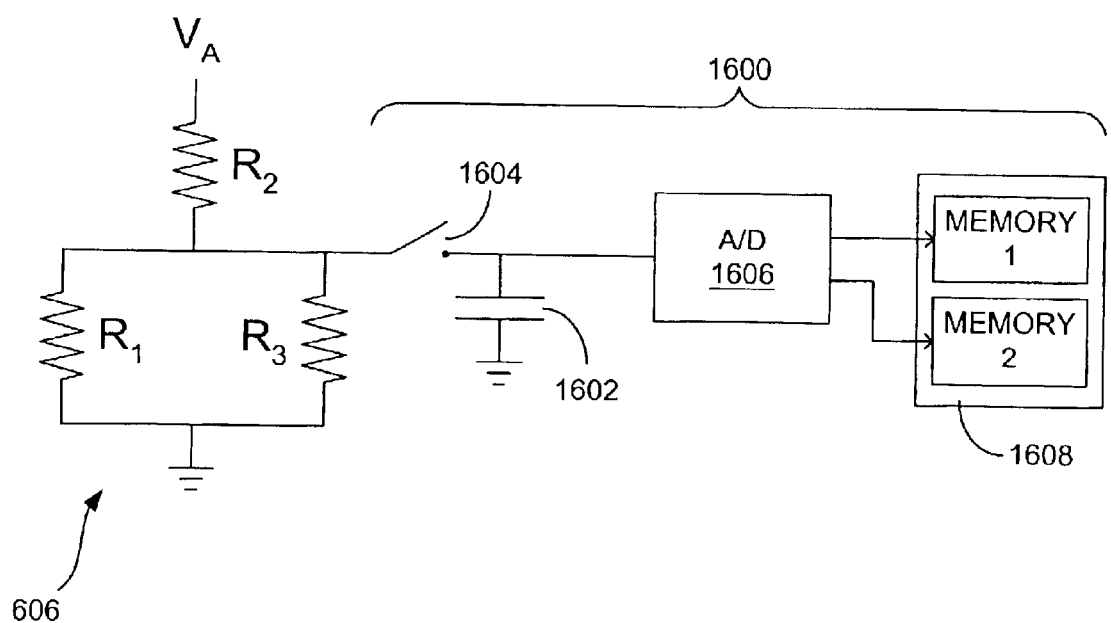
FIG. 16 is a second example sensing circuit that can be used to read data from a magnetic memory device in a non-equipotential reading scheme.

FIG. 16 illustrates another example sensing circuit 1600 that can be used in a non-equipotential reading scheme. In this embodiment, however, the sensing circuit 1600 facilitates a digital, non-equipotential reading scheme. As indicated in FIG. 16, the sensing circuit 1600 includes a single capacitor 1602 that can be electrically coupled to and decoupled from the column conductor of the target memory cell (indicated by the voltage divider 606) with a switch 1604 to again provide sense-and-hold operation. The capacitor output is input into an analog-to-digital (A/D) converter 1606 that converts the analog voltage into a digital value that is stored in one of two memory locations in memory 1608.

During a read operation, $V_A$ is applied to the row conductor coupled to the target memory cell with the switch 1604 closed. The capacitor 1602 quickly reaches a steady-state condition (e.g., after approximately 1 µs). Once this occurs, the switch 1604 is opened and the array voltage, $V_A$, that is applied to the array is shut-off such that $V_A$ is only pulsed on and off in the manner indicated in FIG. 18.

Self-referencing is achieved by writing the target memory cell to a known state and then re-reading it. The switch 1604 is again closed and $V_A$ again applied to the row conductor such that current is provided to the capacitor 1602. Once steady-state is reached, the switch 1604 is opened and the array voltage, $V_A$, is shut-off. Again, this occurs in a short period of time. Once again, the pulse has a duration less than 5 µs and, typically, is no greater than approximately 1 µs. The newly-stored voltage of the capacitor can then be converted into a digital value by the A/D converter 1606 and provided to the second memory location of memory 1608 for comparison to the originally observed value. Through this comparison of the two stored digital values, the original memory state of the target memory cell can be ascertained.

Figure 17:
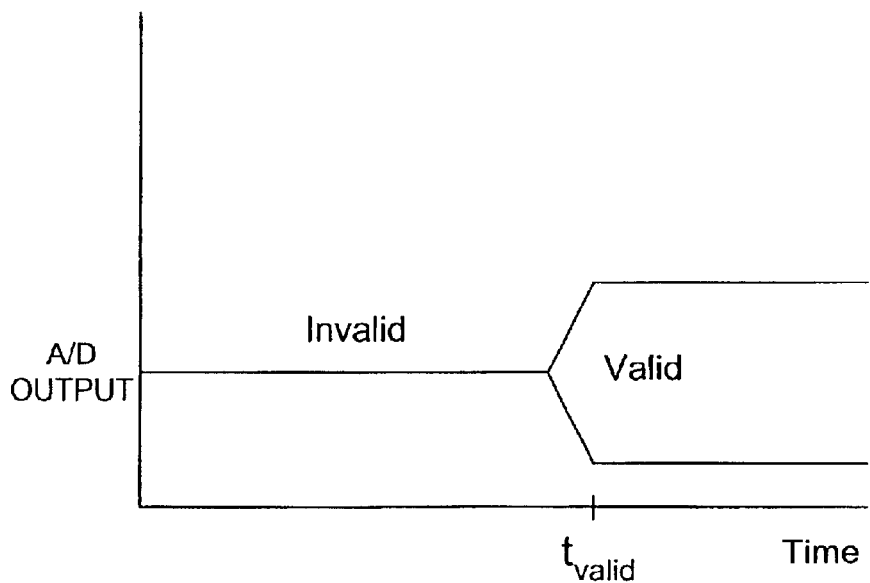
FIG. 17 is a plot of digital output of an analog-to-digital converter of the sensing circuit of FIG. 16 as a function of time.

Although, as indicated in FIG. 17, the analog-to-digital conversion process can require a relatively long time, due to the sense-and-hold capability of the sensing circuit 1600 provided by the capacitor 1604 and switch 1604, the array voltage, $V_A$, need only be pulsed for a short period of time (e.g., 1 µs) as indicated in FIG. 18. Therefore, less current is used and, therefore, less power is consumed.

What is claimed is:

1. A method for reading data from a target memory cell of an array of memory cells, comprising:
   pulsing a voltage on the array for a duration less than 5 microseconds; and
   obtaining a voltage value indicative of a memory state of the target memory cell from the voltage pulse using a sensing circuit that is electrically connected to the target memory cell.

2. The method of claim 1, wherein the pulsing a voltage comprises applying the voltage pulse to a plurality of the conductors of the array in an equipotential reading scheme.

3. The method of claim 1, wherein the pulsing a voltage comprises applying the voltage pulse solely to a conductor that is electrically coupled to the target memory cell in a non-equipotential reading scheme.

4. The method of claim 1, wherein the obtaining a voltage value comprises measuring a voltage drop across a sense element of the sensing circuit.

5. The method of claim 4, wherein the obtaining a voltage value further comprises inputting the magnitude of the voltage drop into a comparator of the sensing circuit.

6. The method of claim 4, wherein the obtaining a voltage value further comprises storing a voltage equal to the voltage drop in a capacitor of the sensing circuit so that the voltage drop can be determined after the voltage is pulsed.

7. The method of claim 1, wherein the obtaining a voltage value comprises measuring the voltage across a conductor that is electrically coupled to the target memory cell and storing the voltage in a capacitor.

8. The method of claim 7, further comprising inputting the voltage stored in the capacitor into a comparator.

9. The method of claim 8, further comprising inputting the voltage stored in the capacitor into an analog-to-digital converter that converts the voltage into a digital value.

10. The method of claim 1, wherein pulsing a voltage comprises pulsing a voltage on the array for no greater than approximately 1 microsecond.

11. A method for reading data from a target memory cell of an array of memory cells, comprising:
    pulsing an array voltage on a plurality of row and column conductors of the array;
    connecting a sensing circuit to a conductor that is electrically coupled to the target memory cell, the sensing circuit including a sense element; and
    ascertaining the voltage drop across the sense element of the sensing circuit during the voltage pulse, the voltage drop being indicative of a memory state of the target memory cell.

12. The method of claim 11, wherein the pulsing an array voltage comprises pulsing an array voltage on substantially every conductor of the array except conductors that are electrically coupled to the target memory cell.

13. The method of claim 11, wherein the ascertaining the voltage drop across the sense element comprises determining the voltage drop using a comparator of the sensing circuit that is electrically coupled to the sense element.

14. The method of claim 13, further comprising comparing the determined voltage drop to a reference voltage to make a determination of the memory state of the target memory cell.

15. The method of claim 11, wherein the ascertaining the voltage drop across the sense element comprises storing a voltage equal to the voltage drop in a capacitor of the sensing circuit.

16. The method of claim 15, further comprising comparing the stored voltage to a reference voltage to make a determination of the memory state of the target memory cell.

17. The method of claim 15, further comprising comparing the stored voltage to a voltage stored on another capacitor of the sensing circuit that was obtained after the target memory cell was written to a known state and resensed using the sensing circuit.

18. A sensing circuit for sensing a memory state of a target memory cell of an array of memory cells, comprising:
    an operational amplifier that is configured to receive an array voltage and output a sense voltage to a conductor of the array that is electrically coupled to the target memory cell;

a voltage source that generates a sense current; and a sense element that is electrically coupled to the operational amplifier and the voltage source.

19. The sensing circuit of claim 18, further comprising a comparator that is electrically connected to the sense element, the comparator being configured to compare a voltage drop across the sense element to a reference voltage to determine a memory state of the target memory cell.

20. The sensing circuit of claim 19, further comprising a memory that is electrically coupled to the comparator so as to receive output from the comparator.

21. The sensing circuit of claim 18, wherein the sense element comprises a field-effect transistor (FET).

22. The sensing circuit of claim 18, wherein the sense element comprises a p-type, metal-oxide field-effect transistor (MOSFET).

23. The sensing circuit of claim 18, further comprising a switch operable to connect and disconnect a capacitor to the array, the capacitor being configured to store a voltage equal to the voltage drop across the sense element after voltage is removed from the array.

24. The sensing circuit of claim 23, further comprising a second switch operable to that connect and disconnect a second capacitor to the array, the second capacitor being configured to store a voltage equal to a second voltage drop across the sense element.

25. A method for reading data from a target memory cell of an array of memory cells, comprising:

pulsing an array voltage on a first conductor electrically coupled to the target memory cell;

connecting a sensing circuit to a second conductor that is electrically coupled to the target memory cell; and determining the voltage on the second conductor during the voltage pulse by storing the voltage within the sensing circuit, the voltage being indicative of a memory state of the target memory cell.

26. The method of claim 25, wherein storing the voltage comprises storing the voltage in a capacitor of the sensing circuit.

27. The method of claim 26, further comprising inputting the stored voltage into a comparator.

28. The method of claim 27, further comprising writing the target memory cell to a known state, storing a second voltage equal to the voltage on the second conductor, storing the second voltage in a second capacitor, and comparing the first and second voltages with the comparator to make the memory state determination.

29. The method of claim 26, further comprising inputting the stored voltage into an analog-to-digital converter.

30. The method of claim 29, further comprising inputting a second voltage stored in the capacitor after the target memory cell was written to a known memory state and comparing the second voltage to the first voltage.

31. A sensing circuit for sensing a memory state of a target memory cell of an array of memory cells, comprising:

a voltage source that generates a sense current;

a capacitor that is configured to store a voltage equal to a voltage on a conductor electrically coupled to the target memory cell; and a switch associated with the capacitor that is configured to connect and disconnect the capacitor to and from the array.

32. The sensing circuit of claim 31, further comprising a comparator that is electrically connected to the capacitor.

33. The sensing circuit of claim 31, further comprising a second switch being configured to connect and disconnect a second capacitor to and from the array.

34. The sensing circuit of claim 31, further comprising an analog-to-digital converter that is electrically connected to the capacitor.

35. The sensing circuit of claim 31, further comprising a memory.

36. A sensing circuit for sensing a memory state of a target memory cell of an array of memory cells, comprising:

an operational amplifier that is configured to receive an array voltage and output a sense voltage to a conductor of the array that is electrically coupled to the target memory cell;

a capacitor that is configured to store a voltage indicative of a memory state of the target memory cell; and a switch associated with the capacitor that is configured to connect and disconnect the capacitor to and from the array such that a voltage can be stored on the capacitor after an array voltage is pulsed on and off the array.

37. The sensing circuit of claim 36, further comprising a sense element.

38. The sensing circuit of claim 36, further comprising a comparator that is configured to compare a first voltage to a reference voltage to determine a memory state of the target memory cell.

39. The sensing circuit of claim 36, further comprising an analog-to-digital converter that is electrically coupled to the capacitor.

40. The sensing circuit of claim 36, further comprising a memory.

* * * * *